United States Patent

Smentek et al.

(10) Patent No.: US 7,904,050 B2
(45) Date of Patent: Mar. 8, 2011

(54) MIXER APPARATUS HAVING SWITCHABLE LOCAL OSCILLATOR INPUTS

(75) Inventors: David J. Smentek, Addison, IL (US); Richard J. Keniuk, Cary, IL (US); Ronald E. Wilson, Kildeer, IL (US)

(73) Assignee: General Instrument Corporation, Horsham, PA (US)

( * ) Notice: Subject to any disclaimer, the term of this patent is extended or adjusted under 35 U.S.C. 154(b) by 568 days.

(21) Appl. No.: 11/302,464

(22) Filed: Dec. 13, 2005

(65) Prior Publication Data

US 2007/0135073 A1 Jun. 14, 2007

(51) Int. Cl.
*H04B 1/26* (2006.01)
(52) U.S. Cl. .......................... 455/326; 455/17; 455/191.2
(58) Field of Classification Search .................... 455/326
See application file for complete search history.

(56) References Cited

U.S. PATENT DOCUMENTS

| | | | | |
|---|---|---|---|---|
| 4,247,953 A | * | 1/1981 | Shinagawa et al. | 455/191.2 |
| 5,187,576 A | * | 2/1993 | Na | 348/485 |
| 5,471,642 A | * | 11/1995 | Palmer | 455/17 |
| 2007/0204184 A1 | * | 8/2007 | Best et al. | 713/401 |

* cited by examiner

*Primary Examiner* — Duc Nguyen
*Assistant Examiner* — Ajibola Akinyemi
(74) *Attorney, Agent, or Firm* — Larry T. Cullen

(57) ABSTRACT

A mixer apparatus (60), such as an integrated circuit (IC) mixer is provided for improving the physical layout of devices containing mixers. The mixer includes a multiplier (62) with an input port (64), an output port (66), a first switchable local oscillator input port (68) and a second switchable local oscillator input port (72). The dual switchable local oscillator ports are located on either side of the mixer, between the input side and the output side. The dual switchable local oscillator ports allow the mixer to provide more flexibility in integrated circuit and printed circuit board design layouts involving mixer apparatus. For example, in dual channel devices, a local oscillator can be coupled to a pair of the mixers using transmission lines that do not have to be routed around the integrated circuit, to a different level of the printed circuit board or underneath one of the mixers.

9 Claims, 2 Drawing Sheets

MIXER APPARATUS HAVING SWITCHABLE LOCAL OSCILLATOR INPUTS

BACKGROUND OF THE INVENTION

1. Field of the Invention

The invention relates to mixers, such as integrated circuit (IC) mixers. More particularly, the invention relates to mixers having multiple local oscillator (LO) inputs.

2. Description of the Related Art

Mixers are widely used in radio communication devices. Mixers often are used to perform frequency translation to either a lower operating frequency, i.e., a downconverter, in receivers, or a higher operating frequency, i.e., an upconverter, in transmitters. With mixers, both downconversion and upconversion is performed with the aid of a local oscillator. Typically, mixers operating at radio frequency (RF) and microwave frequencies exist as part of an integrated circuit (IC) mixer to perform frequency conversion.

In multi-channel devices, e.g., multi-channel receivers and multi-channel transmitters, it often is desirable to use the same type of IC mixer in each channel of the multi-channel design, e.g., for economic reasons and for operating performance reasons. Similarly, it often is desirable to use the same type of IC mixer in both the receiver and transmitter of a transceiver.

In such applications, it is typical to have a common local oscillator (LO) signal drive the mixer for the mixer's use in each channel. Because of this, many conventional IC mixers typically allow for only one local oscillator input pin or one input point into the IC package. However, in the physical layout of a printed circuit board (PCB), such configuration often is less than optimal, especially in applications where the same type of mixer is used for multiple channels. In such applications, the local oscillator signal often has to be routed around the integrated circuit and/or routed to a different layer of the circuit board, e.g., using a via, or the local oscillator signal has to be routed directly underneath the mixer to supply the local oscillator signal to the appropriate local oscillator input pin.

Conventional IC mixers include an IC mixer that accepts two local oscillator inputs, and switches internally between the two inputs based on the desired operating frequency band. However, although such configuration can offer adequate frequency performance, such configuration often is not well suited to improving the overall physical layout of a printed circuit board containing multiple IC mixers.

DETAILED DESCRIPTION

Figure 1:
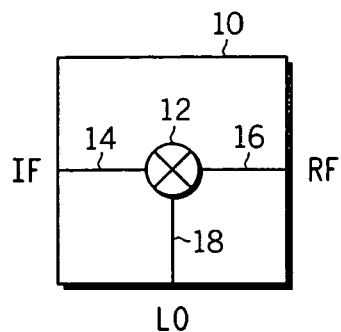
FIG. 1 is a simplified schematic diagram of a conventional mixer, such as an IC mixer.

In the following description, like reference numerals indicate like components to enhance the understanding of the mixer apparatus through the description of the drawings. Also, although specific features, configurations and arrangements are discussed hereinbelow, it should be understood that such specificity is for illustrative purposes only. A person skilled in the relevant art will recognize that other steps, configurations and arrangements are useful without departing from the spirit and scope of the invention.

Referring now to FIG. 1, shown is a simplified schematic diagram of a conventional mixer 10, such as an integrated circuit (IC) mixer. The mixer 10 typically includes a multiplier 12 that has three ports or inputs: an input port 14, an output port 16, and a local oscillator (LO) port 18. The input port 14 is an intermediate frequency (IF) port or a radio frequency (RF) port, depending on whether the mixer 10 is being used as an upconverter or a downconverter. In FIG. 1, the mixer 10 is shown as an upconverter, i.e., the mixer 10 is shown in an upconversion configuration.

In general, the RF port is where the high frequency is applied that is to be downconverted, or, in an upconverter, the RF port is where the high frequency signal is output. Therefore, in a downconversion application, e.g., in receivers, the input port is the RF port and the output port is the IF port. In an upconverter application, e.g., in transmitters, the input port is the IF port and the output port is the RF port.

In FIG. 1, the mixer 10 is shown generally as it would be laid out as a device or device part in an integrated circuit package or as a device or device part on a printed circuit board (PCB). The pinout of the mixer 10 includes the input signal pin (e.g., shown in this application as the IF signal pin) on an input side of the mixer 10 and the output signal pin (e.g., shown in this application as the RF signal pin) on an output side of the mixer 10. Also, the LO signal pin is located on one side of the mixer 10.

In operation, the multiplier 12 mixes or combines an input signal applied to the input port 14 and a local oscillator signal applied to the local oscillator port 18 to produce an output signal at the output port 16. For example, in a receiver (e.g., in a downconversion application), an RF signal is mixed with an LO signal to produce an IF signal, which may then be further amplified and detected to recover information that was modulated on the RF signal. In a transmitter (e.g., in an upconversion application), the process is reversed. That is, an IF signal is mixed with an LO signal to produce an RF signal, which may then be further amplified and transmitted.

Figure 2:
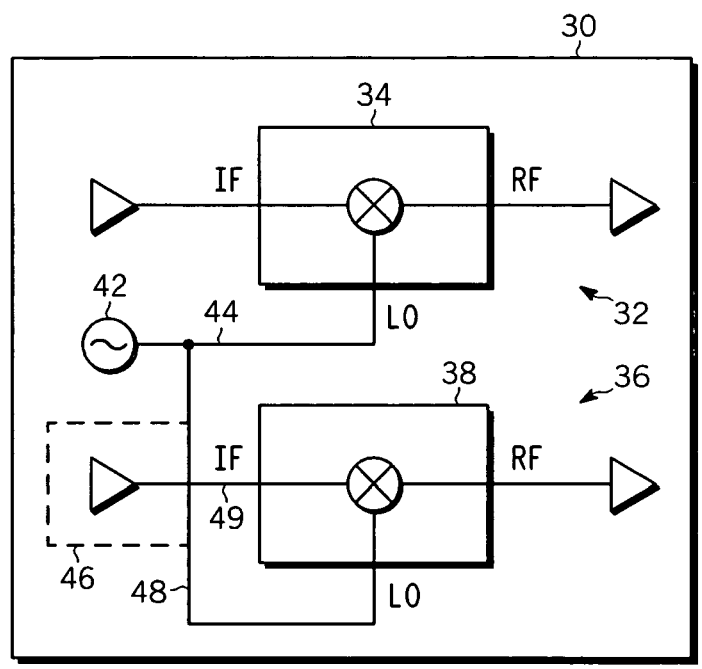
FIG. 2 is a simplified schematic diagram of conventional mixers in a dual channel transmitter design.

Referring now to FIG. 2, shown is a simplified schematic diagram of conventional mixers in a dual channel transmitter or dual channel transmitter package 30. In general, the mixer portions of the dual channel transmitter package 30 are shown as they would be laid out as part of the dual channel transmitters in an IC package or on a printed circuit board. The dual transmitter package 30 includes a first transmitter (shown generally as 32) including a first mixer 34, a second transmitter (shown generally as 36) including a second mixer 38, and a common local oscillator or local oscillator source 42 that drives the local oscillator (LO) input for the IC mixers of both channel transmitters. The remaining portions and stages of the first and second transmitters are included as part of the dual channel transmitter package 30. However, for clarity and simplicity, they are not shown.

Typically, the first and second transmitters 32, 36 are part of the same package. Therefore, the IC mixers typically are the same type of IC mixer and therefore have the same port layouts. That is, the input, output and LO ports are located in the same place on both IC mixers. Because of this, accessing various ports can become problematic given the particular layout shown in FIG. 2. For example, as will be discussed in greater detail hereinbelow, the location of the LO ports on the same side of the respective mixers makes it difficult for the local channel oscillator to be coupled to both LO ports.

The local oscillator signal from the common local oscillator 42 is applied to the LO ports of the first and second transmitters by a transmission line or track, which typically is a microstrip. A first portion 44 of the transmission line can be directly coupled to the LO port of the first transmitter 32. However, another portion of the transmission line, which is applied to the second transmitter 36, must either be routed around the second transmitter 36 (shown generally as 46) or must physically cross over or cross under a part of the second transmitter 36 (shown generally as 48), such as over or under an input transmission line 49 to the second transmitter 36. In the layout of a printed circuit board, to cross over or cross under a portion of the second transmitter 36, the second portion of the common local oscillator transmission line typically must be routed to a different physical layer of the board using a via. Also, if the second transmitter 36 is part of a separate package applied to the board, the package must be added to the board in such a way that the portion 48 of the common local oscillator transmission line passes safely under (or over) the package.

In IC design and manufacture, it is desirable to keep transmission lines as short as possible. Also, it is desirable to reduce or minimize the number of vias between various layers of printed circuit boards. It is understood by those skilled in the art of RF and microwave transmission device package and circuit board design that such practices help to reduce electromagnetic interference (EMI) emissions, to maintain signal quality, and to improve spurious performance. Therefore, as shown in FIG. 2, conventional IC mixers and their packaging often are not necessarily designed with consideration for the physical layout of the printed circuit board and the devices and components on the board.

It may be possible to use different types of IC mixers or differently configured IC mixers to improve the overall layout of a dual channel transmitter package, namely, to provide better access for the common local oscillator to the LO inputs of both mixers. However, the use of different IC mixers may not be cost effective, as many IC packages have multiple components of the same type and configuration already laid out in the package. Also, using different IC mixers or other components may not be cost effective, as common parts are better for purchasing price and inventory management. Moreover, different IC mixers and/or other components may not perform similarly and therefore may not produce the same results.

Figure 3:
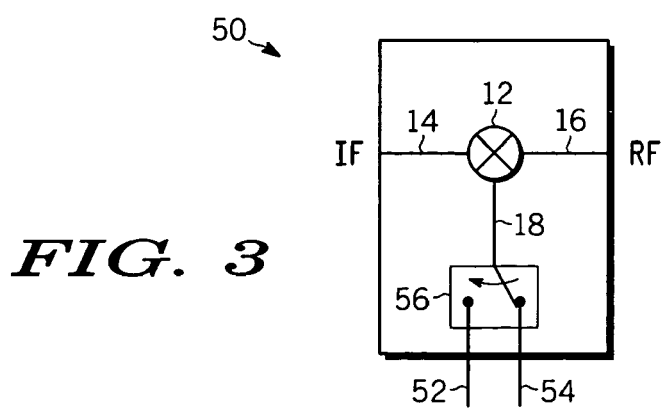
FIG. 3 is a simplified schematic diagram of a conventional dual local oscillator (LO) mixer.

Referring now to FIG. 3, shown is a simplified schematic diagram of a conventional dual local oscillator (LO) mixer 50. Like the mixer 10 (FIG. 1), the mixer 50 includes multiplier 12, which has three input ports: input port 14, output port 16, and local oscillator (LO) port 18. However, the mixer 50 is configured to accept two LO inputs 52, 54, and has an internal switch (shown as 56) that selects one of the two LO inputs 52, 54 based on the desired frequency band of operation of the mixer 50. Although the dual band design of the mixer 50 is advantageous for improved frequency performance, the particular configuration of the mixer 50 does not solve the physical layout problems discussed hereinabove with respect to the LO inputs of the dual channel transmitters 32, 36 in the package 30 shown in FIG. 2.

Figure 4:
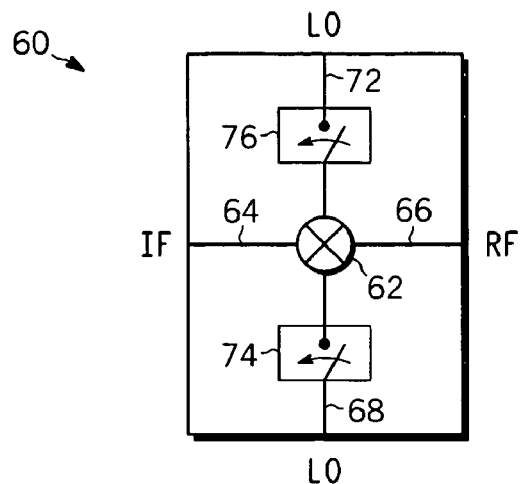
FIG. 4 is a simplified schematic diagram of a mixer having switchable local oscillator inputs.

Referring now to FIG. 4, shown is a simplified schematic diagram of a mixer 60, such as an IC mixer, having switchable local oscillator inputs. As with FIGS. 1-3, it should be understood that, although the mixer 60 in FIG. 4 is shown in an upconversion application, the mixer 60 also is suitable for use in a downconversion application.

The mixer 60 includes a multiplier 62 that has four inputs or ports: an input port 64, an output port 66, a first switchable local oscillator (LO) port 68 and a second switchable local oscillator (LO) port 72. The 4-port configuration of the mixer 60 is compared to conventional mixers, which have only three ports. The switchable local oscillator ports 68, 72 are located on opposite sides of the mixer 60, between an input side and an output side. That is, the first switchable local oscillator port 68 is located on a first side of the mixer 60 between the input port 64 and the output port 66, and the second switchable local oscillator port 72 is located on a second side of the mixer 60 between the input port 64 and the output port 66.

As with the mixer 10 in FIG. 1, the mixer 60 in FIG. 4 is shown generally as it would be laid out as a device or a device part in an integrated circuit package or as a device or a device part on a printed circuit board. The pinout of the mixer 60 includes the input signal pin (shown in this application as the IF signal pin) on an input side of the mixer 60 and the output signal pin (shown in this application as the RF signal pin) on an output side of the mixer 60. The local oscillator (LO) signal pins are located on each side of the mixer 60.

The mixer 60 includes a first switch 74 that switchably connects the first switchable local oscillator port 68 to the multiplier 62, thus allowing a signal applied to the first local oscillator input to be received by the multiplier 62. Similarly, the second switchable local oscillator port 72 has a second switch 76 that switchably connects the second switchable local oscillator port 72 to the multiplier 62, thus allowing a signal applied to the second local oscillator input to be received by the multiplier 62.

The first and second switches 74, 76 can be any suitable switch that can switchably couple the local oscillator ports 68, 72 to the multiplier 62. For example, one or both of the first and second switches 74, 76 can be a single-pole, single-throw (SPST) switch. As such, each SPST switch is operated between a first, closed position that connects the respective oscillator port to the multiplier 62, and a second, open position that does not connect the respective oscillator port to the multiplier 62. Although the switches can be operated independently, their operation should be coordinated so that, at any given time, no more than one local oscillator port is connected to the multiplier 62.

Alternatively, the first and second switches 74, 76 collectively can be part of a single-pole, double-throw (SPDT) switch arrangement, which often is called a changeover switch. In such arrangement, the single-pole, double-throw (SPDT) switch can be switched between a first position, in which one of the local oscillator ports 68, 72 is connected to the multiplier 62 and the other of the local oscillator ports 68, 72 is not connected to the multiplier 68, and a second position, in which the local oscillator port connections are reversed. That is, in the first position of the SPDT switch arrangement, for example, the local oscillator port 68 is connected to the multiplier 62 and the local oscillator port 72 is not connected to the multiplier 62. In the second position, the local oscillator port 68 is not connected to the multiplier 62 and the local oscillator port 72 is connected to the multiplier 62. It should be understood that other suitable switch configurations and/or arrangements, including the use of one or more transistor switches, can be used to connect either of the local oscillator ports 68, 72 to the multiplier 62.

Figure 5:
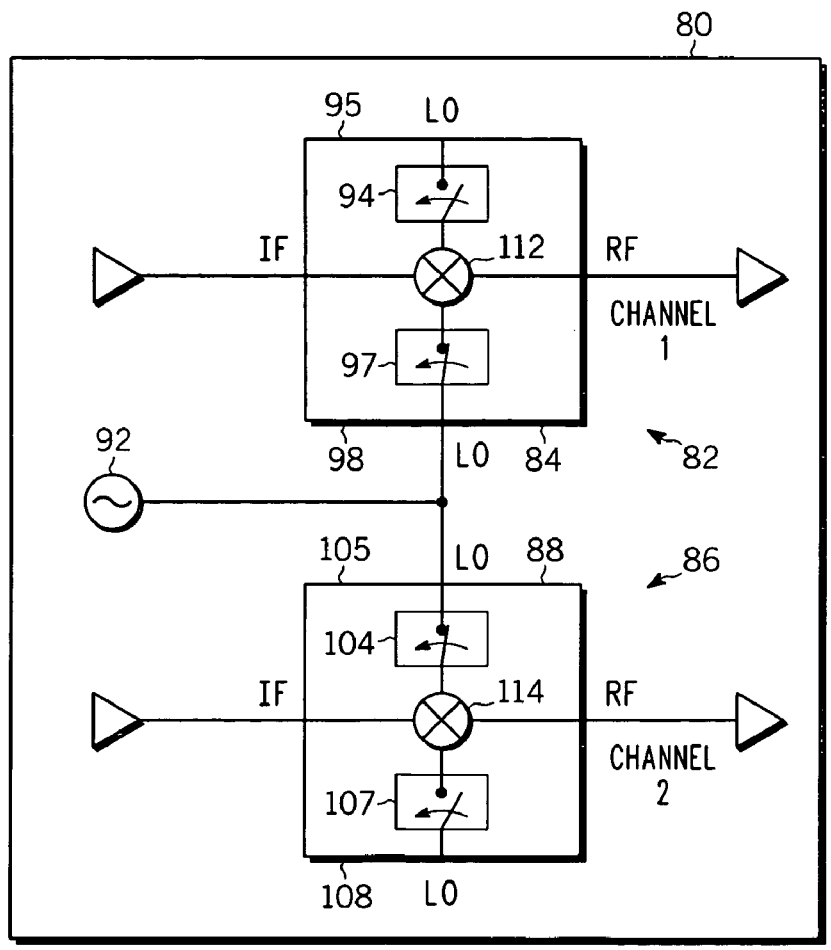
FIG. 5 is a simplified schematic diagram of mixers, having switchable local oscillator inputs, in a dual channel transmitter.

Referring now to FIG. 5, shown is a simplified schematic diagram of a dual channel transmitter or dual channel transmitter package 80 having mixers with switchable local oscillator inputs or input ports. Each of the mixers is configured similar to the mixer 60 shown in FIG. 4, and discussed hereinabove. As with FIGS. 1-4, it should be understood that, although the switchable local oscillator input mixers are shown as upconversion mixers as part of the dual channel transmitter package, the switchable local oscillator input mixers also can be downconversion mixers that are part of a dual channel or dual channel receiver package. Also, alternatively, the switchable local oscillator input mixers can be part of a transceiver package, in which the transmitter would include a switchable local oscillator input upconversion mixer and the receiver would include a switchable local oscillator input downconversion mixer.

The mixer portions of the dual channel transmitter package 80 generally are shown as they would be laid out as part of the dual channel transmitters in an IC package or on a printed circuit board. The dual channel transmitter package 80 includes a first transmitter (shown generally as 82) including a first mixer 84, a second transmitter (shown generally as 86) including a second mixer 88, and a common local oscillator or local oscillator source 92. The common local oscillator source 92 drives one of the two switchable local oscillator (LO) inputs of the mixer 84 and one of the two switchable local oscillator (LO) inputs of the mixer 88. The remaining portions and stages of the first and second transmitters 82, 86 are included as part of the dual channel transmitter package 30, but are not shown for reasons of clarity and simplicity in discussing the first and second mixers 84, 88 in the dual channel transmitter package 80.

The first and second transmitters 82, 86 typically are part of the same package. Thus, the mixers 84, 88 typically are the same type of mixer and therefore have the same port layouts. However, unlike conventional mixers that have only one local oscillator (LO) input, which usually is on the same respective side of both mixers, each of the mixers 84, 88 have two switchable local oscillator (LO) inputs, one switchable local oscillator input on each side of the respective mixer, between the mixer's input side and output side. Such configuration is better suited to an improved physical layout of the devices 82, 86 with respect to the common local oscillator 92 being coupled to a switchable local oscillator input of each mixer 84, 88.

That is, the first mixer 84 has a first switchable local oscillator input 94 on a first side 95 of the mixer 84, between the input side (the IF port side in this particular configuration) and the output side (the RF port side in this particular configuration). The first mixer 84 also has a second switchable local oscillator input 97 on a second side 98 of the mixer 84, between the input side and the output side. Similarly, the second mixer 88 has a first switchable local oscillator input 104 on a first side 105 of the mixer 88, between the input side and the output side, and a second switchable local oscillator input 107 on a second side 108 of the mixer 88, between the input side and the output side.

As with the local oscillator inputs 68, 72 to the mixer 60 (shown in FIG. 3), the first switchable local oscillator input 94 and the second switchable local oscillator input 97 of the first mixer 84 switchably connect to a multiplier 112 in the first mixer 84. Similarly, in the second mixer 88, the first switchable local oscillator input 104 and the second switchable local oscillator input 107 switchably connect to a multiplier 114 in the second mixer 88. In this manner, the configurations of the mixers 84, 88 provide sufficient flexibility to allow the local oscillator 92 to connect to local oscillator inputs of both mixers 84, 88 without having to route local oscillator transmission lines around the mixers 84, 88, or over or under a portion of the mixers 84, 88.

For example, as shown, in the first mixer 84, the first switchable local oscillator input 94 is switched open and the second switchable local oscillator input 97 is switched closed, allowing the local oscillator 92 to connect to the multiplier 112 through the second switchable local oscillator input 97 of the first mixer 84. However, in the second mixer 88, the first switchable local oscillator input 104 is switched closed and the second switchable local oscillator input 107 is switched open, allowing the local oscillator 92 to connect to the multiplier 114 through the second switchable local oscillator input 104 of the second mixer 88.

The switches used to switchably connect the local oscillator inputs 94, 97, 104, 107 in their respective mixers can be any suitable switches or switching arrangements. For example, one or more of the switches can be single-pole, single-throw (SPST) switches, single-pole, double-throw (SPDT) switches, or transistor switches. As with the switching arrangement of the local oscillator inputs in the mixer 60 shown in FIG. 3 and described hereinabove, the operation of the first and second local oscillator inputs 94, 97 in the first mixer 84 is coordinated so that, at any given time, no more than one of the local oscillator ports is connected to the multiplier 112 in the first mixer 84. Similarly, in the second mixer 88, the operation of the first and second local oscillator inputs 104, 107 is coordinated so that, at any given time, no more than one of the local oscillator ports is connected to the multiplier 114.

It will be apparent to those skilled in the art that many changes and substitutions can be made to the mixer apparatus herein described without departing from the spirit and scope of the invention as defined by the appended claims and their full scope of equivalents.

The invention claimed is:

1. An integrated circuit mixer apparatus, comprising:
a multiplier having an input side and an output side;
an input port coupled to the input side of the multiplier;
an output port coupled to the output side of the multiplier;
a first local oscillator (LO) port coupled, via a first switch, to a first side of the multiplier between the input side and the output side; and
a second local oscillator (LO) port coupled, via a second switch which is distinct and separate from the first switch, to a second, opposing side of the multiplier between the input side and the output side, wherein:
the multiplier mixes an input signal applied to the input port with a local oscillator (LO) signal applied to one of the first and second local oscillator (LO) ports to produce an output signal at the output port,
said input port, said output port, said first local oscillator port and said second local oscillator port are distinct and separate ports coupled to the multiplier, and
the apparatus constitutes a downconversion apparatus, wherein the input port further comprises a radio frequency (RF) port, the output port further comprises an intermediate frequency (IF) port, and the multiplier mixes an RF signal applied to the RF port with the local oscillator (LO) signal applied to the local oscillator (LO) port to produce an IF signal at the IF port.

2. The apparatus as recited in claim 1, wherein at least one of the first and second switches comprises a single-pole, single-throw (SPST) switch.

3. The apparatus as recited in claim 1, wherein when the first switch is in a first position, the first local oscillator port is coupled to the multiplier and the second local oscillator port is not coupled to the multiplier and when the first switch is in a second position, the first local oscillator port is not coupled to the multiplier and the second local oscillator port is coupled to the multiplier.

4. The apparatus as recited in claim 3, wherein the at least one of the first and second switches comprises a single-pole, double throw (SPDT) switch.

5. A multi-channel circuit apparatus, comprising:
a first channel device having a first mixer apparatus, the first mixer apparatus comprising:
a first multiplier,
a first input port coupled to an input side of the first multiplier,
a first output port coupled to an output side of the first multiplier,
a first local oscillator (LO) port coupled, via a first switch, to a first side of the first multiplier between the first input side and the first output side of the first multiplier, and
a second local oscillator (LO) port coupled, via a second switch which is distinct and separate from the first switch, to a second, opposing side of the first multiplier between the first input side and the first output side of the first multiplier, said first input port, said first output port, said first local oscillator port and said second local oscillator port are distinct and separate ports coupled to the first multiplier;
a second channel device having a second mixer apparatus, the second mixer apparatus comprising:
a second multiplier,
a second input port coupled to an input side of the second multiplier,
a second output port coupled to an output side of the second multiplier,
a third local oscillator (LO) port coupled, via a third switch, to a first side of the second multiplier between the input side and the output side of the second multiplier, and
a fourth local oscillator (LO) port coupled, via a fourth switch which is distinct and separate from the third switch, to a second, opposing side of the second multiplier between the input side and the output side of the second multiplier, said second input port, said second output port, said third local oscillator port and said fourth local oscillator port are distinct and separate ports coupled to the second multiplier;
a local oscillator positioned between the first and second channel devices, wherein the local oscillator includes a local oscillator transmission line coupled to the local oscillator and coupled between the first local oscillator (LO) port of the first mixer apparatus and the second local oscillator (LO) port of the second mixer apparatus, wherein:
the local oscillator transmission line does not intersect any transmission lines coupled to the first mixer apparatus and the second mixer apparatus, wherein the first multiplier mixes a first input signal applied to the first input port with a local oscillator (LO) signal applied by the local oscillator to one of the first and second local oscillator (LO) ports to produce a first output signal at the first output port,
the second multiplier mixes a second input signal applied to the second input port with the local oscillator (LO) signal applied by the local oscillator to one of the third and fourth local oscillator (LO) ports to produce a second output signal at the second output port, and
the apparatus constitutes a downconversion apparatus, wherein the first and second input ports further comprise radio frequency (RF) ports, the first and second output ports further comprise intermediate frequency (IF) ports, and the first and second multipliers each mix an RF signal applied to their respective RF ports with the local oscillator (LO) signal to produce an IF signal at their respective IF ports.

6. The apparatus as recited in claim 5, wherein the multi-channel circuit apparatus is formed on a printed circuit board, and wherein the first channel device, the second channel device, and the local oscillator are formed on the same physical layer of the printed circuit board.

7. The apparatus as recited in claim 5, wherein the apparatus further comprises a transceiver, wherein the first input port further comprises an intermediate frequency (IF) port, the first output port further comprises a radio frequency (RF) port, and the first multiplier mixes an IF signal applied to the IF port with the local oscillator (LO) signal to produce an RF signal at the RF port, and wherein the second input port further comprises a radio frequency (RF) port, the second output port further comprises an intermediate frequency (IF) port, and the second multiplier mixes an RF signal applied to the RF port with the local oscillator (LO) signal to produce an IF signal at the IF port.

8. The apparatus as recited in claim 5, wherein at least one of the first, second, third and fourth switches comprises a single-pole, single-throw (SPST) switch for switchably coupling at least one of the first, second, third and fourth local oscillator (LO) ports to the multiplier.

9. The apparatus as recited in claim 5, wherein at least one of the first, second, third and fourth switches comprises at least one single-pole, double throw (SPDT) switch, and
wherein at least one of the first, second, third and fourth switches has a first position in which one of the local oscillator ports is coupled to the multiplier and the other of the local oscillator ports is not coupled to the multiplier, and a second position in which one of the local oscillator ports is not coupled to the multiplier and the other local oscillator port is coupled to the multiplier.

* * * * *